United States Patent
Chung

(10) Patent No.: US 9,799,816 B2
(45) Date of Patent: Oct. 24, 2017

(54) APPARATUS AND METHOD FOR HARVESTING ENERGY IN AN ELECTRONIC DEVICE

(71) Applicant: QUALCOMM Incorporated, San Diego, CA (US)

(72) Inventor: Woo Cheol Chung, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 322 days.

(21) Appl. No.: 14/676,729

(22) Filed: Apr. 1, 2015

(65) Prior Publication Data

US 2015/0207053 A1    Jul. 23, 2015

Related U.S. Application Data

(62) Division of application No. 13/554,990, filed on Jul. 20, 2012, now Pat. No. 9,190,595.

(51) Int. Cl.
*H01L 35/30* (2006.01)
*H01L 37/00* (2006.01)
(Continued)

(52) U.S. Cl.
CPC .............. *H01L 35/30* (2013.01); *H01L 24/49* (2013.01); *H01L 25/16* (2013.01); *H01L 35/32* (2013.01);
(Continued)

(58) Field of Classification Search
CPC combination set(s) only.
See application file for complete search history.

(56) References Cited

U.S. PATENT DOCUMENTS

| 4,687,879 A | 8/1987 | Hendricks |
| 5,419,780 A * | 5/1995 | Suski ...................... H01L 23/38 |
| | | 136/201 |

(Continued)

FOREIGN PATENT DOCUMENTS

| CN | 101931347 A | 12/2010 |
| JP | 2007042895 A | 2/2007 |

(Continued)

OTHER PUBLICATIONS

International Search Report and Written Opinion—PCT/US2013/051133—ISA/EPO—dated Jan. 17, 2014.

*Primary Examiner* — Eli Mekhlin
(74) *Attorney, Agent, or Firm* — Arent Fox LLP

(57) ABSTRACT

An apparatus, a method, and a computer program product are provided. The apparatus may be an electronic component. The electronic component includes at least one energy harvester coupled between at least one pair of hot and cold regions of the electronic component and configured to convert thermal energy to electrical energy in order to provide power to at least the electronic component, the at least one energy harvester including a radiative thermal channel or a conductive thermal channel. A first end of the conductive thermal channel is coupled to a first semiconductor material and a second end of the conductive thermal channel is coupled to a second semiconductor material, the first semiconductor material being coupled to the hot region and isolated from the cold region and the second semiconductor material being coupled to the cold region and isolated from the hot region.

9 Claims, 14 Drawing Sheets

(51) Int. Cl.
*H01L 35/32* (2006.01)
*H01L 23/00* (2006.01)
*H01L 25/16* (2006.01)

(52) U.S. Cl.
CPC ........... *H01L 2224/16225* (2013.01); *H01L 2224/48145* (2013.01); *H01L 2224/48227* (2013.01); *H01L 2224/49* (2013.01); *H01L 2225/06562* (2013.01); *H01L 2924/00014* (2013.01); *H01L 2924/12042* (2013.01); *H01L 2924/14* (2013.01); *H01L 2924/1425* (2013.01)

(56) References Cited

U.S. PATENT DOCUMENTS

| | | | |
|---|---|---|---|
| 5,921,087 A * | 7/1999 | Bhatia | F25B 21/02 |
| | | | 136/203 |
| 6,084,173 A | 7/2000 | DiMatteo | |
| 6,396,191 B1 | 5/2002 | Hagelstein et al. | |
| 2005/0077619 A1* | 4/2005 | Ramanathan | H01L 23/38 |
| | | | 257/719 |
| 2008/0209237 A1 | 8/2008 | Kim | |
| 2009/0151765 A1 | 6/2009 | Han et al. | |
| 2011/0146741 A1* | 6/2011 | Hida | H01L 35/08 |
| | | | 136/205 |
| 2012/0017964 A1 | 1/2012 | Hussain et al. | |
| 2014/0020728 A1 | 1/2014 | Chung | |

FOREIGN PATENT DOCUMENTS

| | | |
|---|---|---|
| JP | 2011176970 A | 9/2011 |
| WO | 2004084272 A2 | 9/2004 |

\* cited by examiner

US 9,799,816 B2

APPARATUS AND METHOD FOR HARVESTING ENERGY IN AN ELECTRONIC DEVICE

CROSS-REFERENCE TO RELATED APPLICATION(S)

This application is a divisional application of U.S. Non-Provisional application Ser. No. 13/554,990, entitled "APPARATUS AND METHOD FOR HARVESTING ENERGY IN AN ELECTRONIC DEVICE" and filed on Jul. 20, 2012, which issued as U.S. Pat. No. 9,190,595 on Nov. 17, 2015, the disclosure of which is incorporated by reference herein in its entirety.

BACKGROUND

Field

The present disclosure relates generally to harvesting energy, and more particularly, to an apparatus and method for harvesting energy in an electronic device.

Background

Mobile electronic devices generally use a battery, which can typically supply power for only a few hours at a time based on the capacity of the battery and the usage of the mobile electronic device. Accordingly, there has been a substantial effort toward the development of techniques for reducing power consumption of the electronic components in the mobile electronic devices. However, as the demand for performance from the electronic components in such mobile electronic devices continues to increase, a substantial amount of thermal energy, i.e., heat, is generated by the electronic components despite the techniques for reducing power consumption.

For example, there is an increasing demand for advanced features and performance in specific areas, such as modems, multimedia, and high speed serial interfaces. To support such advanced features, mobile, applications, media, and modem processor integrated circuits (ICs) are now being designed to include multiple central processing unit (CPU) cores. For example, the power consumption of a Krait CPU core is estimated at 1 watt (W). For quad Krait CPU cores, the estimated power consumption will increase linearly to 4 W if used concurrently. A substantial amount of resources have been allocated to reduce or minimize thermal impacts that may result from the increase of device temperatures as operating power consumption increases.

However, if such thermal energy generated by an electronic component may be converted to electrical energy, the mobile electronic devices will be able to support more advanced features and longer standby times. In addition, engineering efforts for reducing power consumption of the electronic components in the mobile electronic devices may be directed toward other areas in need of development.

SUMMARY

In an aspect of the disclosure, an apparatus, a method, and a computer program product are provided. The apparatus may be a mobile electronic device, such as a mobile phone. The mobile electronic device includes an electronic component and at least one energy harvester coupled between at least one pair of hot and cold regions of the electronic component and configured to convert thermal energy to electrical energy in order to provide power to at least the electronic component, the at least one energy harvester including a radiative thermal channel or a conductive thermal channel. A first end of the conductive thermal channel is coupled to a first semiconductor material and a second end of the conductive thermal channel is coupled to a second semiconductor material, the first semiconductor material being coupled to the hot region and isolated from the cold region and the second semiconductor material being coupled to the cold region and isolated from the hot region.

DETAILED DESCRIPTION

Figure 1:
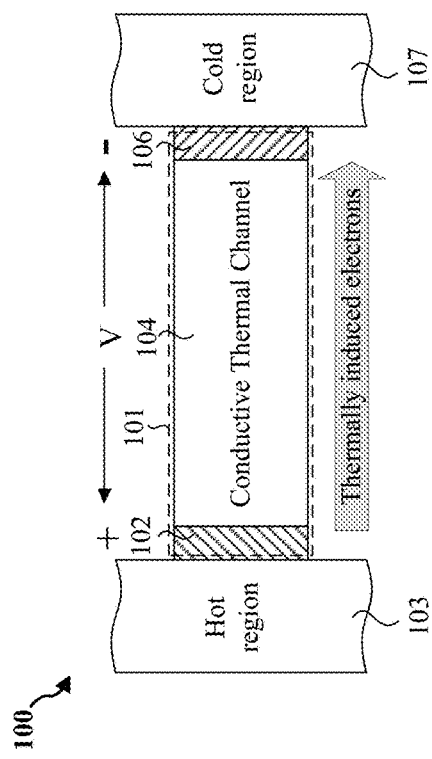
FIG. 1 is a diagram illustrating an energy harvester configuration for converting thermal energy to electrical energy via a conductive thermal channel.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of harvesting energy in an electronic device will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

An energy harvester is a device that can capture energy from an outside source. In one configuration, an energy harvester may include a thermoelectric transducer, which can be used to harness thermal energy by converting the thermal energy to electrical energy. Such a thermoelectric transducer may typically include a heat receiver, a heat transmitter, and a thermal channel coupled between the heat receiver and the heat transmitter. The theoretical limit of the maximum possible efficiency for thermoelectrical conversion is the Carnot limit, which can be determined using the following equation:

$$\text{Carnot limit} = (T_{hot} - T_{cold})/T_{hot} \qquad \text{(equation 1)}$$

where $T_{hot}$ and $T_{cold}$ are absolute temperatures in Kelvin (K). For example, if there is a thermal flow between a heat source at 100 degrees Celsius (° C.) (i.e., $T_{hot}$=373K) and a heat sink at 20° C. (i.e., $T_{cold}$=293K), the Carnot limit will be 21.4%. The power gain associated with the Carnot limit is known to be the reciprocal of the Carnot limit. Therefore, in this example, the power gain will be 4.67.

FIG. 1 is a diagram illustrating an energy harvester configuration 100 for converting thermal energy to electrical energy via a conductive thermal channel. As shown in FIG. 1 the energy harvester 101 includes a hot pad 102, a cold pad 106, and a conductive thermal channel 104. The conductive thermal channel 104 is coupled between the hot pad 102 and the cold pad 106. In one configuration, the conductive thermal channel 104 may be a physical connection between the hot pad 102 and the cold pad 106. For example, the hot pad 102 and the cold pad 106 may each include a conductive material, such as copper, and the conductive thermal channel 104 may be a wire bond, a wire on a printed circuit board (PCB) or a printed wiring board (PWB), a thermal diode or a specific material for optimum efficiency in converting thermal energy to electrical energy. A thermal diode is a type of diode that is implemented in a thermoelectric semiconductor, and designed either for energy conversion or for refrigeration. It has been shown that a thermal diode having a cold-side including $Hg_{0.86}Cd_{0.14}Te$ [mercury-cadmium-telluride] and a hot-side including InSb [indium antimonide] may achieve a maximum efficiency of 35%.

As shown in FIG. 1, the hot pad 102 is coupled to the hot region 103 and the cold pad 106 is coupled to the cold region 107. For example, the hot region 103 may be a bonding pad situated on a semiconductor die (also referred to as a "semiconductor chip") and the cold region 107 may be a bonding pad situated on a different semiconductor die or a substrate. For example, the hot region 103 may be at 100° C. and the cold region 107 may be at 20° C. As shown in FIG. 1, the temperature difference between the hot pad 102 and the cold pad 106 causes a flow of thermally induced electrons from the hot pad 102 to the cold pad 106 via the conductive thermal channel 104 and produces an electric potential (i.e., a voltage amount "V") across the hot pad 102 and the cold pad 106.

Figure 2:
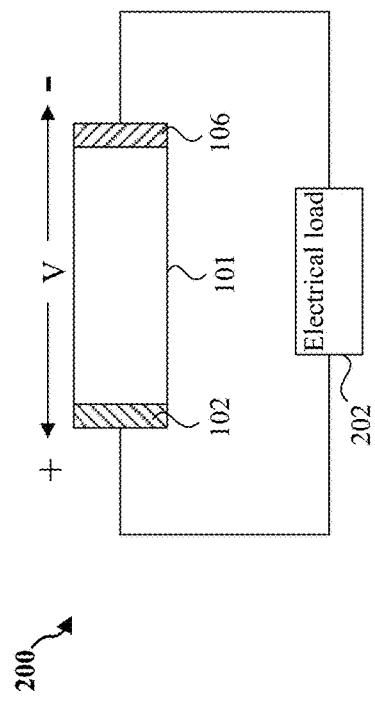
FIG. 2 is a diagram illustrating an exemplary electrical circuit showing the energy harvester driving an electrical load.

FIG. 2 is a diagram illustrating an exemplary electrical circuit 200 showing the energy harvester 101 driving an electrical load 202. In FIG. 2, the hot pad 102 and the cold pad 106 of energy harvester 101 are coupled to the electrical load 202, such that the voltage produced across the hot pad 102 and the cold pad 106 drives the electrical load 202. For example, the electrical load 202 may be an integrated circuit or a battery.

Figure 3:
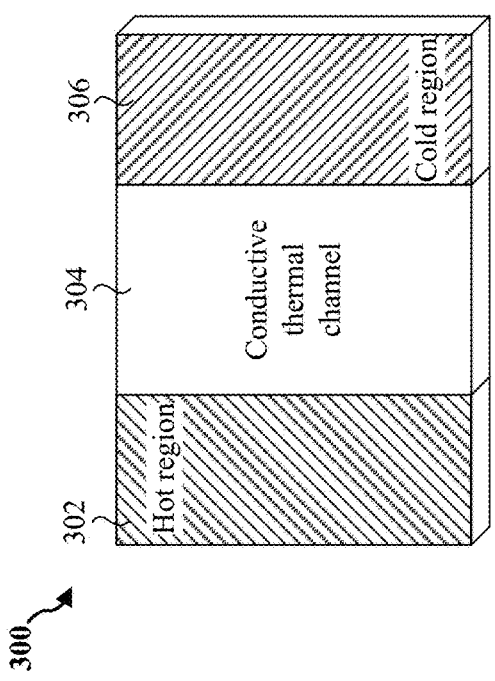
FIG. 3 is a diagram illustrating a semiconductor die configured with an energy harvester.

FIG. 3 is a diagram illustrating a semiconductor die 300 configured with an energy harvester. As shown in FIG. 3, the energy harvester includes the hot pad 302, the conductive thermal channel 304, and the cold pad 306. The hot pad 302 is situated on a hot region of semiconductor die 300 and the cold pad 306 is situated on a cold region of the semiconductor die 300.

Figure 4:
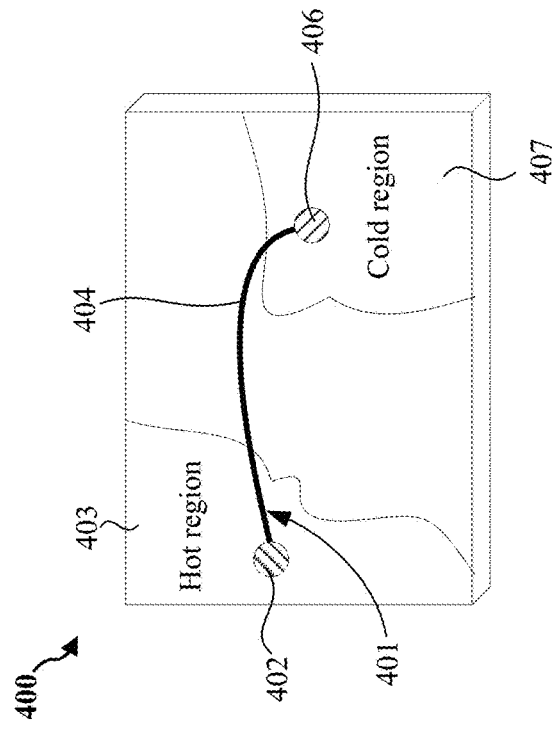
FIG. 4 is a diagram illustrating a semiconductor die configured with an energy harvester.

FIG. 4 is a diagram illustrating a semiconductor die 400 configured with an energy harvester. As shown in FIG. 4, the energy harvester 401 includes the hot pad 402, the conductive thermal channel 404, and the cold pad 406. The hot pad 402 is situated on a hot region 403 of semiconductor die 400 and the cold pad 406 is situated on a cold region 407 of the semiconductor die 400.

Figure 5:
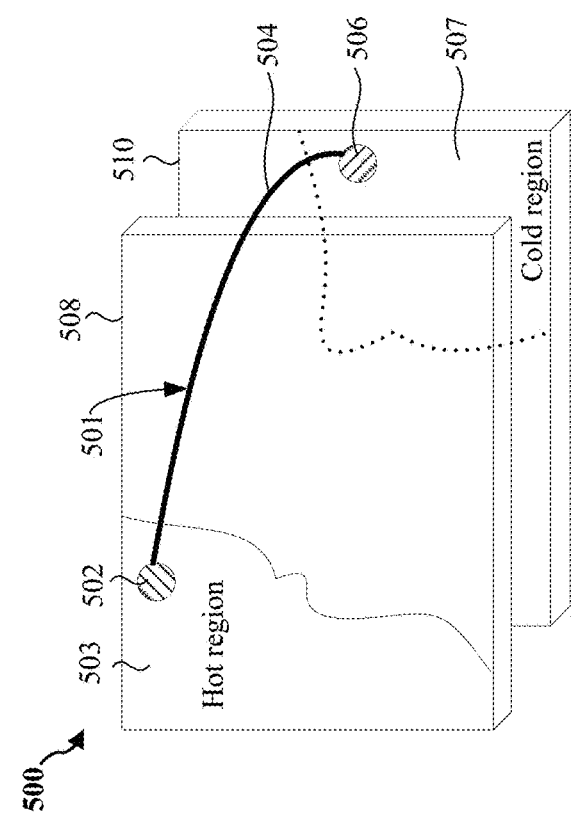
FIG. 5 is a diagram illustrating a top view of a multiple semiconductor die configuration including an energy harvester.

FIG. 5 is a diagram illustrating a top view of a multiple semiconductor die configuration 500 including an energy harvester. As shown in FIG. 5, multiple semiconductor die configuration 500 includes semiconductor die 508 situated over semiconductor die 510. The energy harvester 501 includes the hot pad 502, the conductive thermal channel 504, and the cold pad 506. The hot pad 502 is situated on a hot region 503 of semiconductor die 508 and the cold pad 506 is situated on a cold region 507 of the semiconductor die 510.

Figure 6:
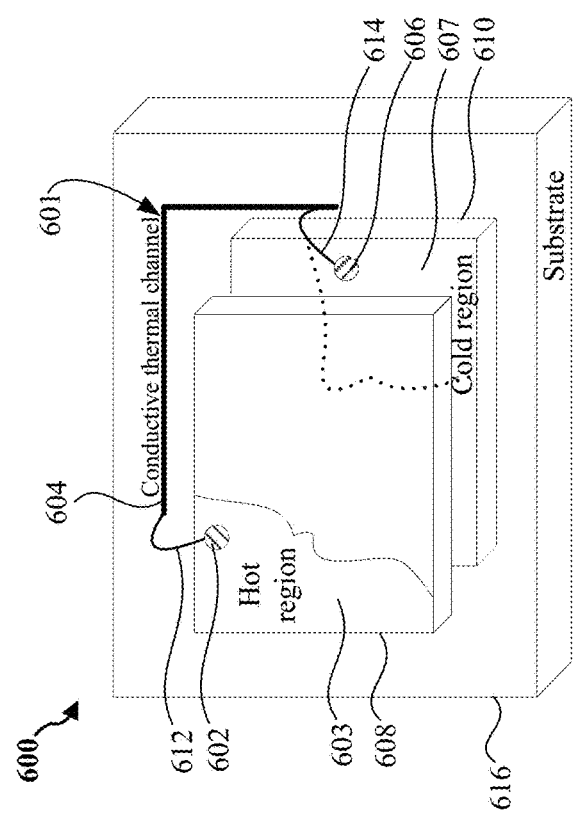
FIG. 6 is a diagram illustrating a top view of a multiple semiconductor die configuration including an energy harvester.

FIG. 6 is a diagram illustrating a top view of a multiple semiconductor die configuration 600 including an energy harvester. As shown in FIG. 6, multiple semiconductor die configuration 600 includes semiconductor die 608 situated above semiconductor die 610. As further shown in FIG. 6, the semiconductor die 610 is situated above the substrate 616, which may be a substrate of an IC. The energy harvester 601 includes the hot pad 602, the conductive thermal channel 604, and the cold pad 606. The hot pad 602 is situated on the hot region 603 of the semiconductor die 608 and the cold pad 606 is situated on the cold region 607 of the semiconductor die 610. In the configuration of FIG. 6, the conductive thermal channel 604 is situated on the surface of substrate 616, such that one end of the conductive thermal channel 604 is coupled to the hot pad 602 via the connection 612 and another end of the conductive thermal channel 604 is coupled to the cold pad 606 via the connection 614.

Figure 7:
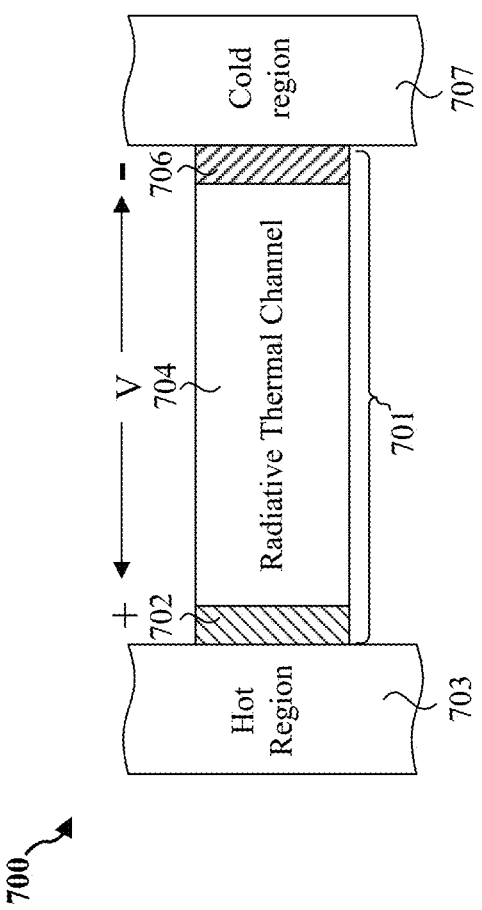
FIG. 7 is a diagram illustrating an energy harvester configuration for converting thermal energy to electrical energy via a radiative thermal channel.

FIG. 7 is a diagram illustrating an energy harvester configuration 700 for converting thermal energy to electrical energy via a radiative thermal channel. As shown in FIG. 7, energy harvester 701 includes the hot pad 702, the cold pad 706, and the radiative thermal channel 704. The radiative thermal channel 704 is coupled between the hot pad 702 and the cold pad 706. In the configuration of FIG. 7, the radiative thermal channel 704 is an air gap between the hot pad 702 and the cold pad 706. For example, the hot pad 702 and the cold pad 706 may each be a conductive material, such as a copper.

As shown in FIG. 7, the hot pad 702 is coupled to the hot region 703 and the cold pad 706 is coupled to the cold region 707. For example, the hot region 703 may be a bonding pad situated on a semiconductor die and the cold region 707 may be a bonding pad situated on a different semiconductor die or a substrate. For example, the hot region 703 may be at 100° C. and the cold region 707 may be at 20° C. As shown in FIG. 7, the temperature difference between the hot pad 702 and the cold pad 706 produces an electric potential (i.e., a voltage amount "V") across the hot pad 702 and the cold pad 706. The electric potential may be used to drive an electrical load, such as an IC or a battery.

Figure 8:
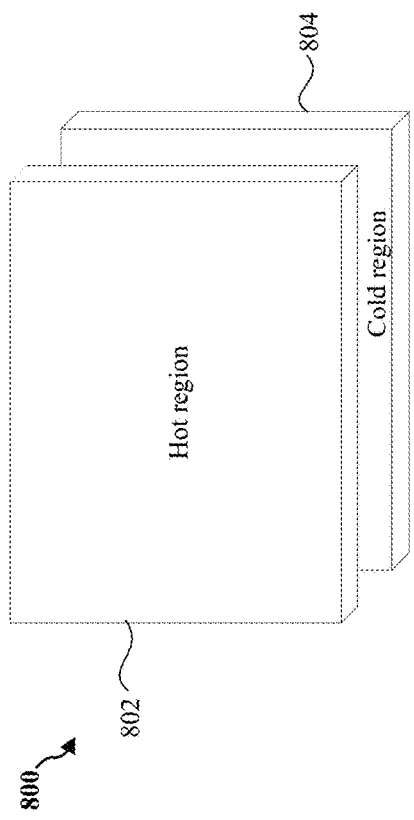
FIG. 8 is a diagram illustrating a top view of a multiple semiconductor die configuration including an energy harvester.

FIG. 8 is a diagram illustrating a top view of a multiple semiconductor die configuration 800 including an energy harvester. Multiple semiconductor die configuration 800 includes a semiconductor die 802 situated above a semiconductor die 804. As shown in FIG. 8, the semiconductor die 802 has a hot region and the semiconductor die 804 has a cold region. An energy harvester (not shown in FIG. 8) may be situated between the semiconductor die 802 and the semiconductor die 804 as described with reference to FIG. 9.

Figure 9:
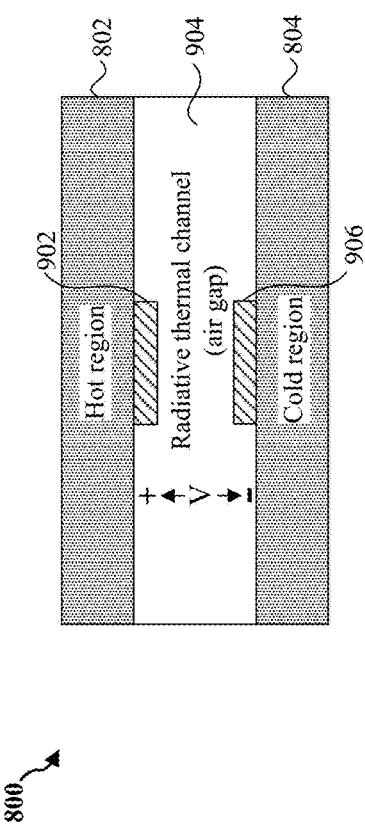
FIG. 9 is a diagram illustrating a cross sectional view of the multiple semiconductor die configuration shown in FIG. 8.

FIG. 9 is a diagram illustrating a cross sectional view of the multiple semiconductor die configuration 800 shown in FIG. 8. As shown in FIG. 9, the energy harvester includes the hot pad 902, the cold pad 906, and the radiative thermal channel 904. In the configuration of FIG. 9, the radiative thermal channel 904 is an air gap between the semiconductor die 802 and semiconductor die 804. The hot pad 902 is coupled to a hot region on semiconductor die 802 and the cold pad 906 is coupled to a cold region on the semiconductor die 804.

In FIGS. 3-6, 8 and 9, electrical loads that may be driven by an energy harvester have been omitted for ease of illustration and to maintain clarity. Moreover, it should be understood that the semiconductor dies discussed in FIGS. 3-6, 8 and 9 may be situated in an IC. It should also be understood that more than two semiconductor dies may be included in an IC. For example, if an IC is a dynamic random access memory (DRAM) IC, then such IC may include six semiconductor dies in a multi-chip package (MCP) and four semiconductor dies in a package on package (PoP).

Figure 10:
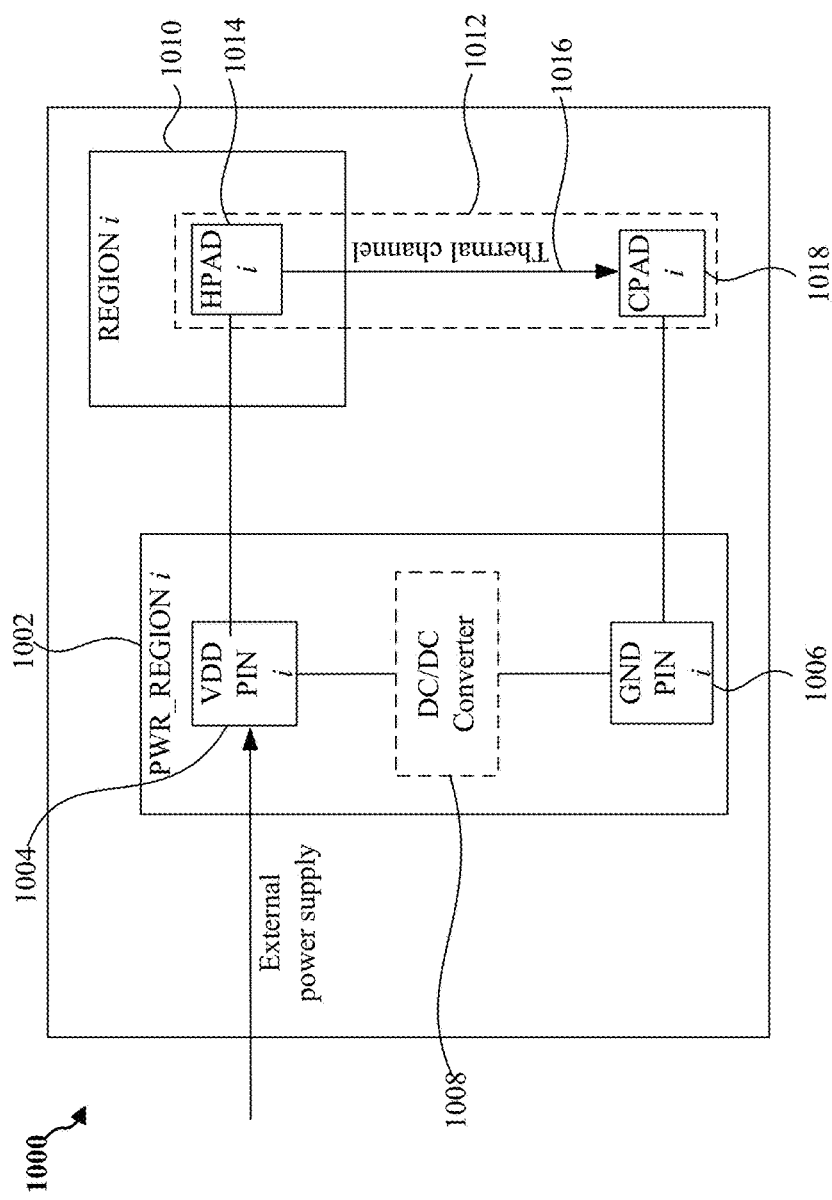
FIG. 10 is a block diagram illustrating an electronic device configured with an energy harvester.

FIG. 10 is a block diagram illustrating an electronic device 1000 configured with an energy harvester. For example, the electronic device 1000 may be an electronic component, such as an IC, situated in a mobile electronic device, such as a mobile phone or a laptop. The electronic device 1000 includes power region ("PWR_REGION i") 1002 having power pins/nets ("VDD PIN i") 1004 and ground pins/nets ("GND PIN i") 1006. The electronic device 1000 further includes a hot region ("REGION i") 1010, which may be a hot surface of a semiconductor die in the electronic device 1000. The electronic device 1000 further includes energy harvester 1012 having a thermal channel 1016 coupled between a pair of hot and cold pads. As shown in FIG. 10, one end of the thermal channel 1016 is coupled to the hot pad ("HPAD i") 1014 situated in the hot region 1010 and another end of the thermal channel 1016 is coupled to a cold pad ("CPAD i") 1018 situated in a cold region of the electronic device 1000, such as on the substrate in the electronic device 1000. Therefore, the hot pad 1014 may be used as a transmit port for transmitting thermal energy and cold pad 1018 may be used as a receiver port for receiving electrical energy.

It should be understood that electronic device 1000 may be configured to include one or more pairs of hot and cold pads, each pair of hot and cold pads having a thermal channel coupled between the hot and cold pads. In the configuration of FIG. 10, the hot pad 1014 represents an ith thermal pad in a high temperature region of the electronic device 1000 and the cold pad 1018 represents an ith thermal pad in a relatively low temperature region of the electronic device 1000, where the difference in temperature between the high temperature region and the low temperature region enables the energy harvester 1012 to convert thermal energy into electrical energy (also referred to as "harvested electrical energy") via the thermal channel 1016. The thermal channel 1016 may be a conductive thermal channel as previously discussed with respect to FIG. 1 or a radiative thermal channel as discussed with respect to FIG. 7.

The electronic device 1000 may include internal connections from pads to corresponding external solder balls/pins, which may be configured for power/ground or signals. Such internal connections may be either a flip chip type or a wire bond type. As shown in FIG. 10, the hot pad 1014 may be coupled to power pins/nets 1004 and the cold pad 1018 may be coupled to ground pins/nets 1006. Therefore, the energy harvester 1012 may deliver harvested electrical energy from the hot pad 1014 to the power pins/nets 1004.

In FIG. 10, an optional direct current-to-direct current (DC/DC) converter 1008 is optionally coupled between the power pins/nets 1004 and the ground pins/nets 1006. For example, if the temperature at the hot pad 1014 increases substantially above approximately 220° C., the DC/DC converter 1008 may not be needed due to the high conversion efficiency of the energy harvester 1012 at such high temperatures. However, since the temperature of electronic device packages are generally controlled so as not to exceed a predefined maximum case temperature of 85° C., for example, at the top of the electronic device package, the DC/DC converter 1008 may be used to boost the harvested electrical energy. In one configuration, the harvested electrical energy may be used by the electronic device 1000 as it is being generated by the energy harvester 1012. In another configuration, the harvested electrical energy may be stored for later use or delivered to another electronic device.

Figure 11:
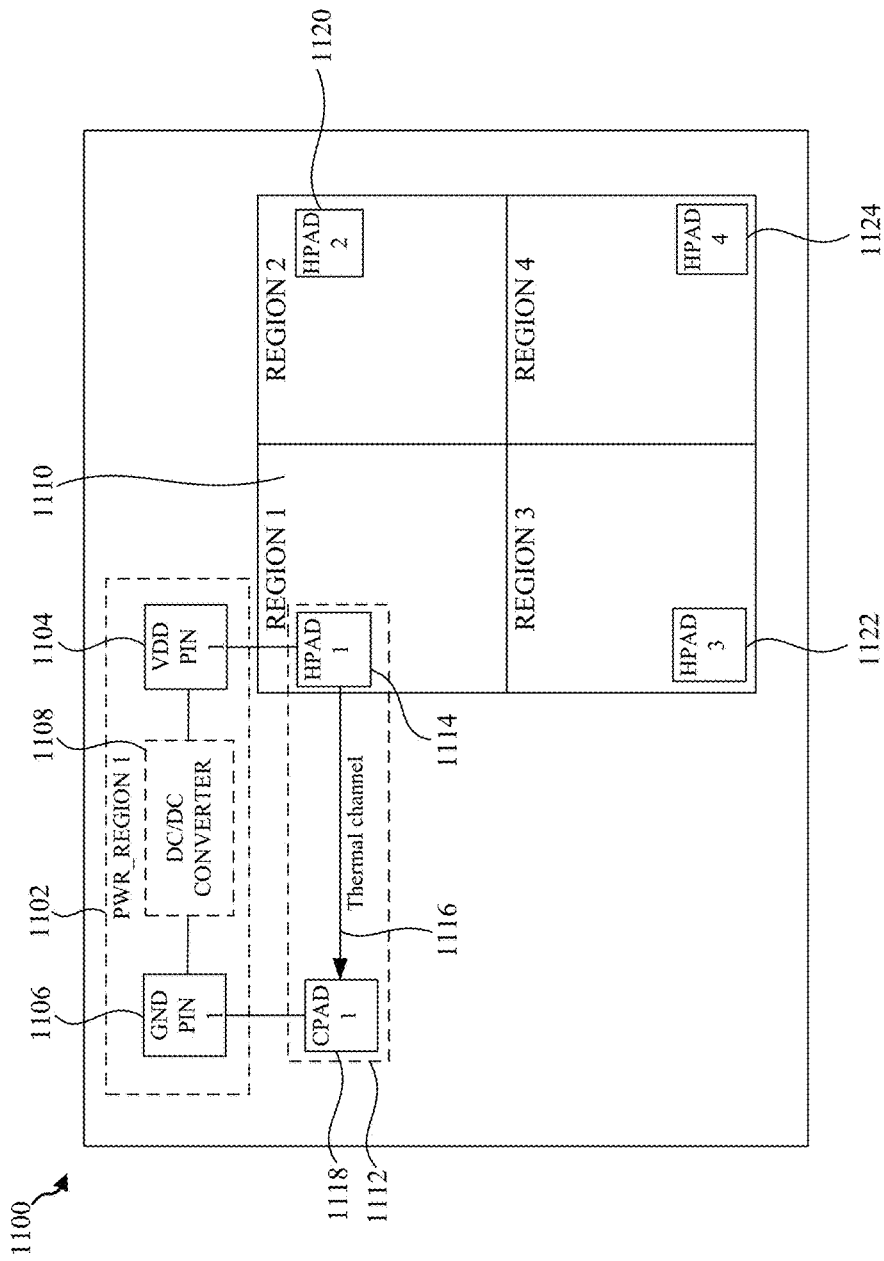
FIG. 11 is a block diagram illustrating an electronic device configured with an energy harvester.

FIG. 11 is a block diagram illustrating an electronic device 1100 configured with an energy harvester. For example, the electronic device 1100 may be an electronic component, such as an IC, situated in a mobile electronic device, such as a mobile phone or a laptop. The electronic device 1100 includes power region ("PWR_REGION 1") 1102 having a power pin/net ("VDD PIN 1") 1104 and a ground pin/net ("GND PIN 1") 1106. The electronic device 1100 further includes a hot region ("REGION 1") 1110, which may be a hot surface of a semiconductor die of the electronic device 1100. The electronic device 1100 further includes energy harvester 1112 having a thermal channel 1116 coupled between a pair of hot and cold pads. As shown in FIG. 11, one end of the thermal channel 1116 is coupled to a hot pad ("HPAD 1") 1114 situated in the hot region 1110 and another end of the thermal channel 1116 is coupled to a cold pad ("CPAD 1") 1118 situated in a cold region of the electronic device 1100, such as on the substrate of the electronic device 1100. Therefore, the hot pad 1114 may be used as a transmit port for transmitting thermal energy and cold pad 1018 may be used as a receiver port for receiving converted electrical energy.

In the configuration of FIG. 11, since the hot pad 1114 is situated in a high temperature region (e.g., "Region 1" 1110) of the electronic device 1100 and the cold pad 1118 is situated in a relatively low temperature region, the difference in temperature between the high temperature region and the low temperature region enables the energy harvester 1112 to convert thermal energy into electrical energy via the thermal channel 1116. The thermal channel 1116 may be a conductive thermal channel as previously discussed with respect to FIG. 1 or a radiative thermal channel as discussed with respect to FIG. 7.

As shown in FIG. 11, the hot pad 1114 may be coupled to power pin/net 1104 and the cold pad 1118 may be coupled to ground pin/net 1106. Therefore, the energy harvester 1112 may deliver harvested electrical energy from the hot pad 1114 to the power pin/net 1104. In the configuration of FIG. 11, the optional DC/DC converter 1108 is coupled between the power pin/net 1104 and the ground pin/net 1106 to boost the harvested electrical energy. In other configurations, the DC/DC converter 1108 may be omitted. The harvested electrical energy may be used by the electronic device 1100 and/or the mobile electronic device as it is being generated by the energy harvester 1112 or may be stored for later use.

The configuration of FIG. 11 includes four hot pads (e.g., hot pads 1114, 1120, 1122, and 1124). Accordingly, multiple energy harvesters may be used for either boosting a single power supply net or boosting multiple independent power nets. It can be appreciated that one or multiple energy harvesters may be used for an optimum design.

Figure 12:
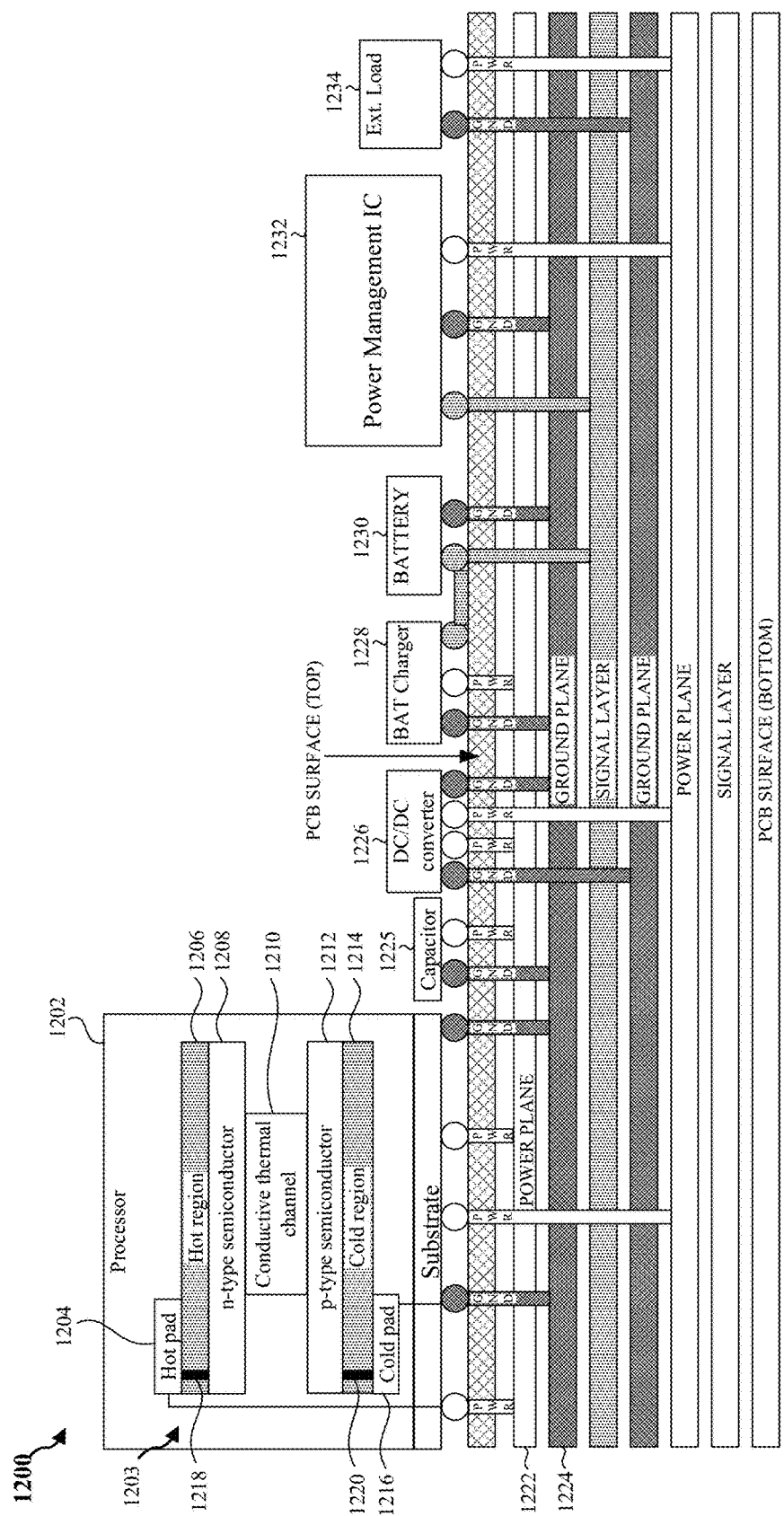
FIG. 12 is a diagram illustrating a cross sectional view of a power distribution in a mobile electronic device configured with an energy harvester.

FIG. 12 is a diagram illustrating a cross sectional view of a power distribution in a mobile electronic device 1200 configured with an energy harvester. The mobile electronic device 1200 includes IC 1202, capacitor 1225, DC/DC converter 1226, battery charger module 1228, battery 1230, power management IC 1232, and external load 1234. For example, the external load 1234 may include light emitting diodes (LEDs) and discrete radio frequency (RF) components. In one configuration, the IC 1202 may be a processor. As shown in FIG. 12, IC 1202 includes energy harvester 1203, which includes a semiconductor material 1208 coupled to a hot region of semiconductor die 1206, a semiconductor material 1212 coupled to a cold region of semiconductor die 1214, and a conductive thermal channel coupled between the semiconductor materials 1208 and 1212. The energy harvester 1203 further includes the hot pad 1204 situated at the exterior of semiconductor die 1206 and coupled to the semiconductor material 1208 via conductive path 1218, and further includes the cold pad 1216 situated at the exterior of semiconductor die 1214 and coupled to the semiconductor material 1212 via conductive path 1220. For example, the semiconductor material 1208 may be an n-type semiconductor material and the semiconductor material 1212 may be a p-type semiconductor material. As shown in FIG. 12, the semiconductor material 1208 is isolated from the cold region of semiconductor die 1214 and the semiconductor material 1212 is isolated from the hot region of semiconductor die 1206.

The conductive thermal channel 1210 may be a conductive material, such as a wire. As shown in FIG. 12, the hot pad 1204 is coupled to the power plane 1222 and the cold pad 1216 is coupled to the ground plane 1224. In the configuration of FIG. 12, the battery 1230 is the primary power source for the mobile electronic device 1200, which provides power to the power management IC 1232. The power management IC 1232 provides power to the DC/DC converter 1226, which then provides power to the IC 1202. The capacitor 1225 is configured to suppress noise on the power plane 1222.

In the configuration of FIG. 12, the IC 1202 receives power via the power plane 1222. As the mobile electronic device 1200 operates the IC 1202, the energy harvester 1203 may be configured to convert thermal energy generated by the semiconductor die 1206 into electrical energy via the conductive thermal channel 1210. Accordingly, the energy harvester 1203 may deliver the harvested electrical energy to the IC 1202 or to the DC/DC converter 1226 for supplying power to the external load 1234.

Figure 13:
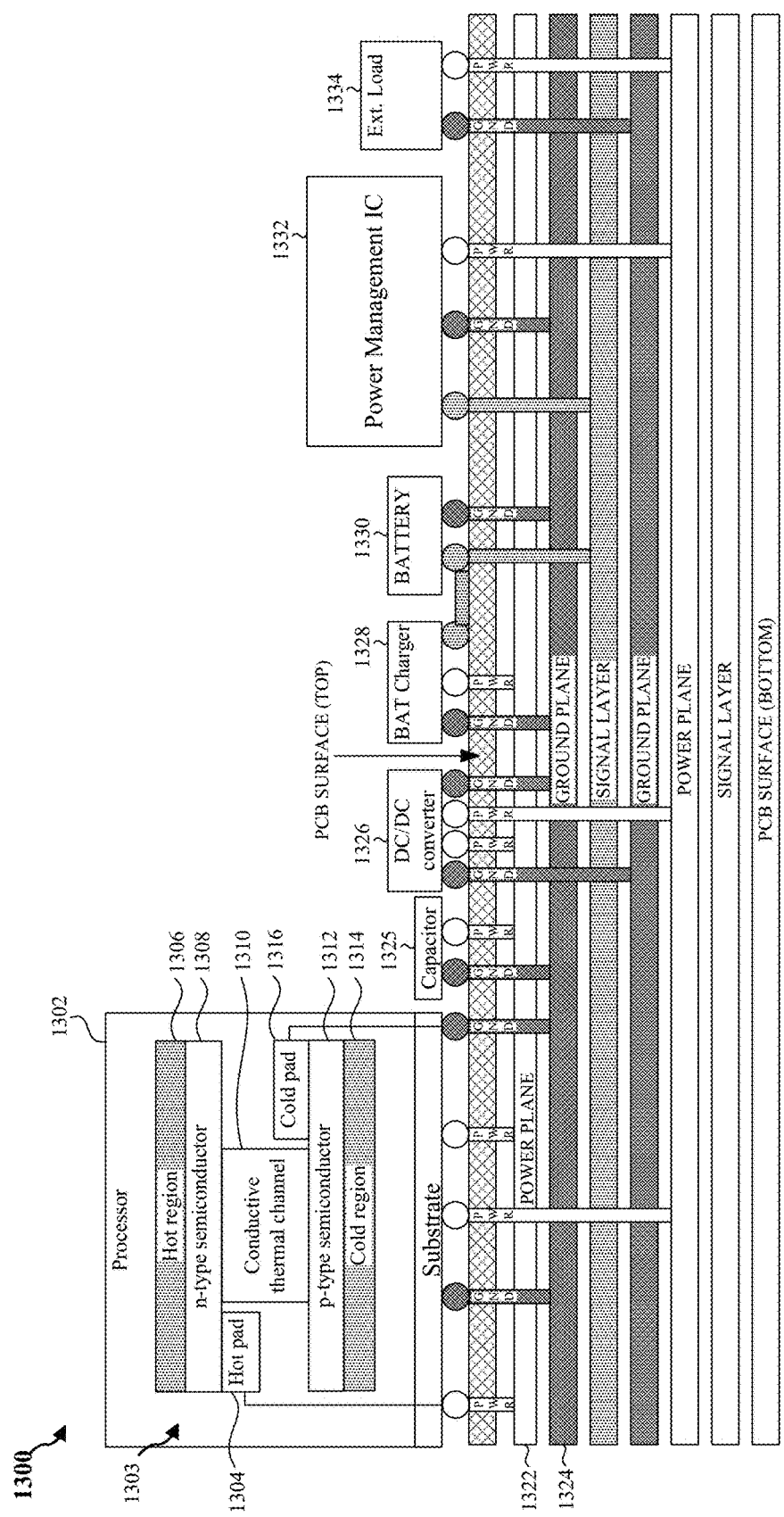
FIG. 13 is a diagram illustrating a cross sectional view of a power distribution in a mobile electronic device configured with an energy harvester.

FIG. 13 is a diagram illustrating a cross sectional view of a power distribution in a mobile electronic device 1300 configured with an energy harvester. The mobile electronic device 1300 includes IC 1302, capacitor 1325, DC/DC converter 1326, battery charger module 1328, battery 1330, power management IC 1332, and external load 1334. In one configuration, the IC 1302 may be a processor. As shown in FIG. 13, IC 1302 includes energy harvester 1303, which includes a semiconductor material 1308 coupled to a hot region of semiconductor die 1306, a semiconductor material 1312 coupled to a cold region of semiconductor die 1314, and a conductive thermal channel 1310 coupled between the semiconductor materials 1308 and 1312. The energy harvester 1303 further includes the hot pad 1304 coupled to the semiconductor material 1308, and further includes the cold pad 1316 coupled to the semiconductor material 1312. For example, the semiconductor material 1308 may be an n-type semiconductor material and the semiconductor material 1312 may be a p-type semiconductor material. As shown in FIG. 13, the semiconductor material 1308 is isolated from the cold region of semiconductor die 1314 and the semiconductor material 1312 is isolated from the hot region of semiconductor die 1306.

The conductive thermal channel 1310 may be a conductive material, such as a wire. As shown in FIG. 13, the hot pad 1304 is coupled to the power plane 1322 and the cold pad 1316 is coupled to the ground plane 1324. In the configuration of FIG. 13, the battery 1330 is the primary power source for the mobile electronic device 1300, which provides power to the power management IC 1332. The power management IC 1332 provides power to the DC/DC converter 1326, which then provides power to the IC 1302.

In the configuration of FIG. 13, the IC 1302 receives power via the power plane 1322. As the mobile electronic device 1300 operates the IC 1302, the energy harvester 1303 may be configured to convert thermal energy generated by the semiconductor die 1306 into electrical energy via the conductive thermal channel 1310. Accordingly, the energy harvester 1303 may deliver the harvested electrical energy to the IC 1302 or to the DC/DC converter 1326 for supplying power to the external load 1334.

Figure 14:
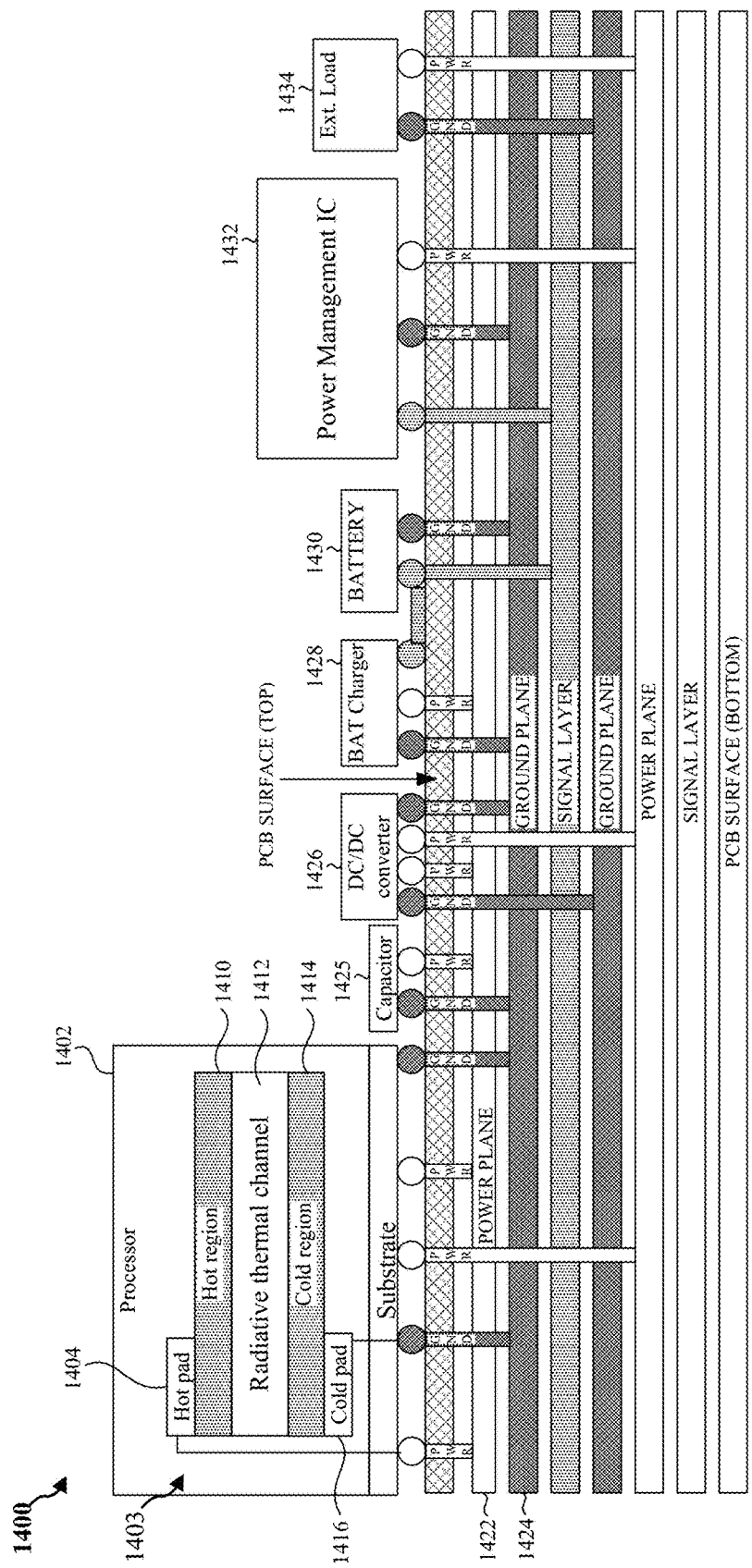
FIG. 14 is a diagram illustrating a cross sectional view of a power distribution in a mobile electronic device configured with an energy harvester.

FIG. 14 is a diagram illustrating a cross sectional view of a power distribution in a mobile electronic device 1400 configured with an energy harvester. The mobile electronic device 1400 includes IC 1402, capacitor 1425, DC/DC converter 1426, battery charger module 1428, battery 1430, power management IC 1432, and external load 1434. In one configuration, the IC 1402 may be a processor. As shown in FIG. 14, IC 1402 includes energy harvester 1403, which includes the hot pad 1404 coupled to the hot region of the semiconductor die 1410, and further includes the cold pad 1416 coupled to the cold region of the semiconductor die 1414. The energy harvester 1403 further includes the radiative thermal channel 1412 coupled between the hot region of the semiconductor die 1410 and the cold region of the semiconductor die 1414. In the configuration of FIG. 14, the radiative thermal channel 1412 is an air gap.

As shown in FIG. 14, the hot pad 1404 is coupled to the power plane 1422 and the cold pad 1416 is coupled to the ground plane 1424. In the configuration of FIG. 14, the battery 1430 is the primary power source for the mobile electronic device 1400, which provides power to the power management IC 1432. The power management IC 1432 provides power to the DC/DC converter 1426, which then provides power to the IC 1402.

In the configuration of FIG. 14, the IC 1402 receives power via the power plane 1422. As the mobile electronic device 1400 operates the IC 1402, the energy harvester 1403 may be configured to convert thermal energy generated by the semiconductor die 1410 into electrical energy via the radiative thermal channel 1412. Accordingly, the energy harvester 1403 may deliver the harvested electrical energy to the IC 1402 or to the DC/DC converter 1426 for supplying power to the external load 1434.

Figure 15:
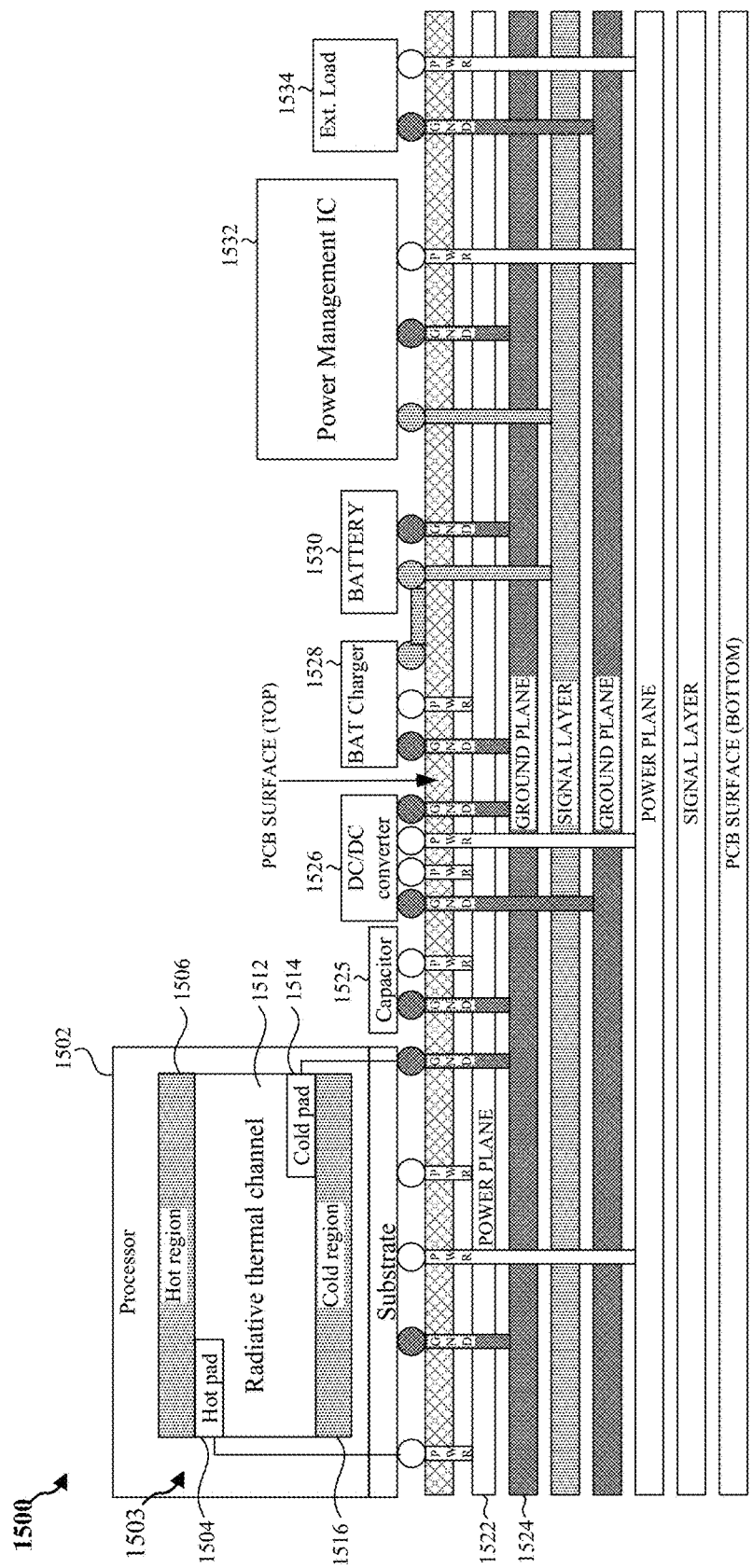
FIG. 15 is a diagram illustrating a cross sectional view of a power distribution in a mobile electronic device configured with an energy harvester.

FIG. 15 is a diagram illustrating a cross sectional view of a power distribution in a mobile electronic device 1500 configured with an energy harvester. The mobile electronic device 1500 includes IC 1502, capacitor 1525, DC/DC converter 1526, battery charger module 1528, battery 1530, power management IC 1532, and external load 1534. In one configuration, the IC 1502 may be a processor. As shown in FIG. 15, IC 1502 includes energy harvester 1503, which includes the hot pad 1504 coupled to the hot region of the semiconductor die 1506, and further includes the cold pad 1514 coupled to the cold region of the semiconductor die 1516. The energy harvester 1503 further includes the radiative thermal channel 1512 coupled between the hot region of the semiconductor die 1506 and the cold region of the semiconductor die 1516. In the configuration of FIG. 15, the radiative thermal channel 1512 is an air gap.

As shown in FIG. 15, the hot pad 1504 is coupled to the power plane 1522 and the cold pad 1514 is coupled to the ground plane 1524. In the configuration of FIG. 15, the battery 1530 is the primary power source for the mobile electronic device 1500, which provides power to the power management IC 1532. The power management IC 1532 provides power to the DC/DC converter 1526, which then provides power to the IC 1502.

In the configuration of FIG. 15, the IC 1502 receives power via the power plane 1522. As the mobile electronic device 1500 operates the IC 1502, the energy harvester 1503 may be configured to convert thermal energy generated by the semiconductor die 1506 into electrical energy via the radiative thermal channel 1512. Accordingly, the energy harvester 1503 may deliver the harvested electrical energy to the IC 1502 or to the DC/DC converter 1526 for supplying power to the external load 1534.

Figure 16:
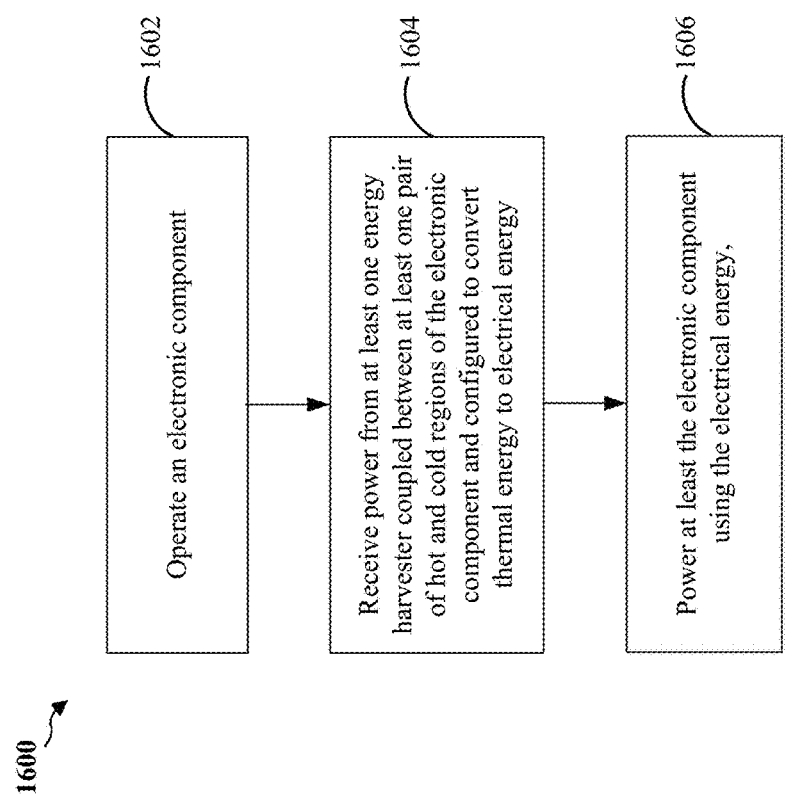
FIG. 16 is a flow chart 1600 of a method for harvesting energy in an electronic device.

FIG. 16 is a flow chart 1600 of a method for harvesting energy in an electronic device. At step 1602, the electronic device may operate an electronic component. In one configuration, the electronic component may be an IC. For example, the mobile device may include a power source, such as a battery, for powering the IC.

At step 1604, the mobile device may receive power from at least one energy harvester coupled between at least one pair of hot and cold regions of the electronic component and configured to convert thermal energy to electrical energy, the at least one energy harvester including a radiative thermal channel or a conductive thermal channel. A first end of the conductive thermal channel is coupled to a first semiconductor material and a second end of the conductive thermal channel is coupled to a second semiconductor material, the first semiconductor material being coupled to the hot region and isolated from the cold region and the second semiconductor material being coupled to the cold region and isolated from the hot region. For example, the first semiconductor material may be an n-type semiconductor material and the second semiconductor material may be a p-type semiconductor material. The difference in temperature between the hot and cold regions of the electronic component enables the energy harvester to convert thermal energy into electrical energy. The hot region may be a bonding pad situated on a first die of the electronic component and the cold region may be a different bonding pad situated on a substrate or a second die of the electronic component. In an aspect, the hot region may be a first pad coupled to a power pin of the electronic component and the cold region may be a second pad coupled to a ground pin of the electronic component. In one configuration, the conductive thermal channel may include a wire bond. In another configuration, the radiative thermal channel may be an air gap.

At step 1606, the mobile device may power at least the electronic component using the electrical energy. For example, the mobile device may use the harvested electrical energy to power the electronic component as it is being generated by the energy harvester. Alternatively, the mobile device may store the harvested electrical energy for later use or deliver the harvested electrical energy to another electronic device.

Figure 17:
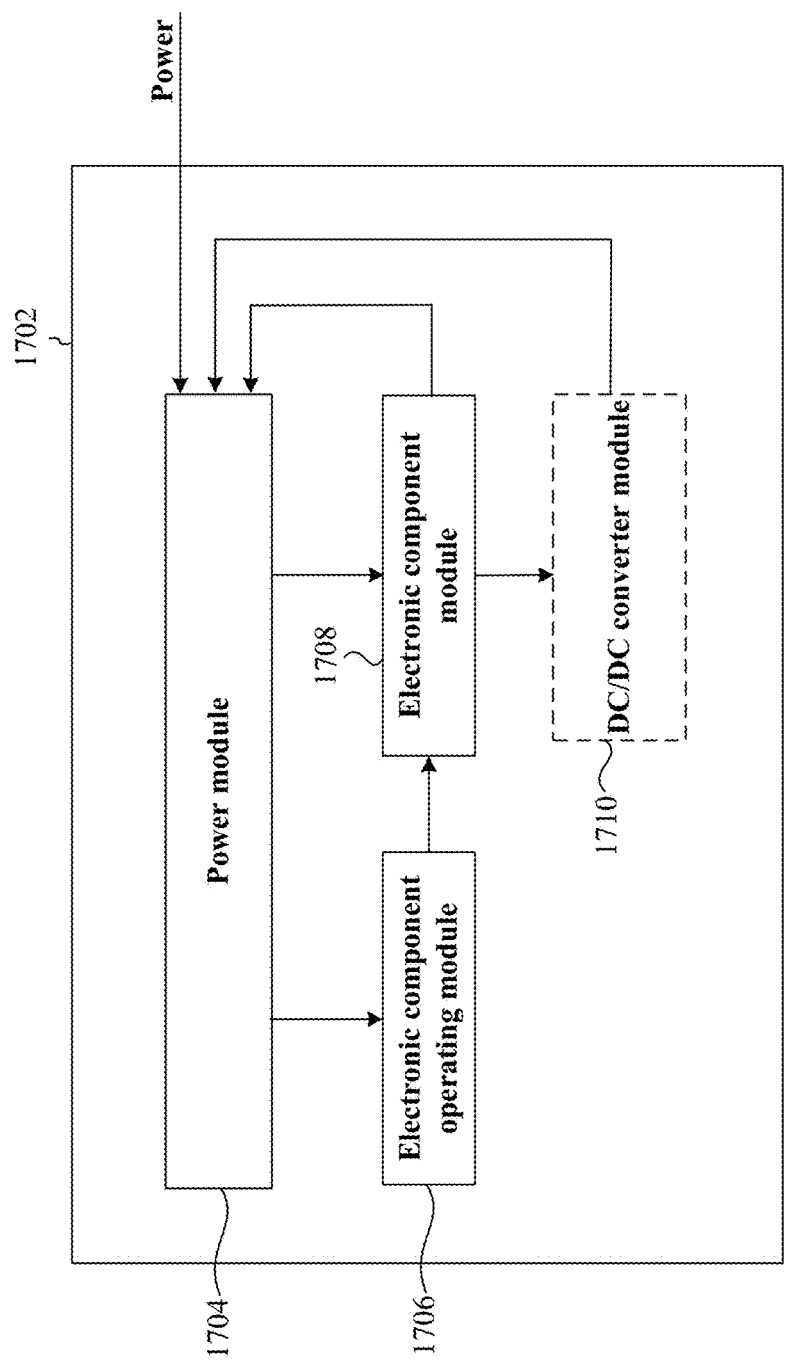
FIG. 17 is a conceptual flow diagram illustrating the power flow between different modules/means/components in an exemplary apparatus.

FIG. 17 is a conceptual flow diagram 1700 illustrating the power flow between different modules/means/components in an exemplary apparatus 1702. The apparatus may be a mobile device. The apparatus 1702 includes a power module 1704, an electronic component operating module 1706, an electronic component module 1708, and an optional DC/DC converter module 1710.

The power module 1704 provides power to the electronic component operating module 1706 and the electronic component module 1708. In one configuration, the power module 1704 may be a battery configured to supply power to the apparatus 1702. The electronic component operating module 1706 operates (e.g., activates and/or controls) the electronic component module 1708. In one configuration, the electronic component operating module 1706 may be a processor and the electronic component module 1708 may be a memory IC package. In another configuration, the electronic component operating module 1706 and the electronic component module 1708 may each be a processor.

The power module 1704 receives power from at least one energy harvester coupled between at least one pair of hot and cold regions of the electronic component module 1708 and configured to convert thermal energy to electrical energy. The at least one energy harvester may include a radiative thermal channel or a conductive thermal channel. A first end of the conductive thermal channel is coupled to a first semiconductor material and a second end of the conductive thermal channel is coupled to a second semiconductor material, the first semiconductor material being coupled to the hot region and isolated from the cold region and the second semiconductor material being coupled to the cold region and isolated from the hot region. For example, the first semiconductor material may be an n-type semiconductor material and the second semiconductor material may be a p-type semiconductor material. The hot region may be a bonding pad situated on a first die of the electronic component module 1708 and the cold region may be a different bonding pad situated on a substrate or a second die of the electronic component module 1708. In an aspect, the hot region may be a first pad coupled to a power pin of the electronic component module 1708 and the cold region may be a second pad coupled to a ground pin of the electronic component module 1708. In one configuration, the conductive thermal channel may include a wire bond. In another configuration, the radiative thermal channel may be an air gap. The power module 1704 may also receive power from an outside source, such as an external power supply.

In one configuration, the electronic component module 1708 provides harvested electrical energy to the optional DC/DC converter module 1710, which is configured to boost the harvested electrical energy and to provide the boosted electrical energy to the power module 1704.

The apparatus may include additional modules that perform each of the steps in the aforementioned flow chart FIG. 16. As such, each step in the aforementioned flow chart FIG. 16 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 18:
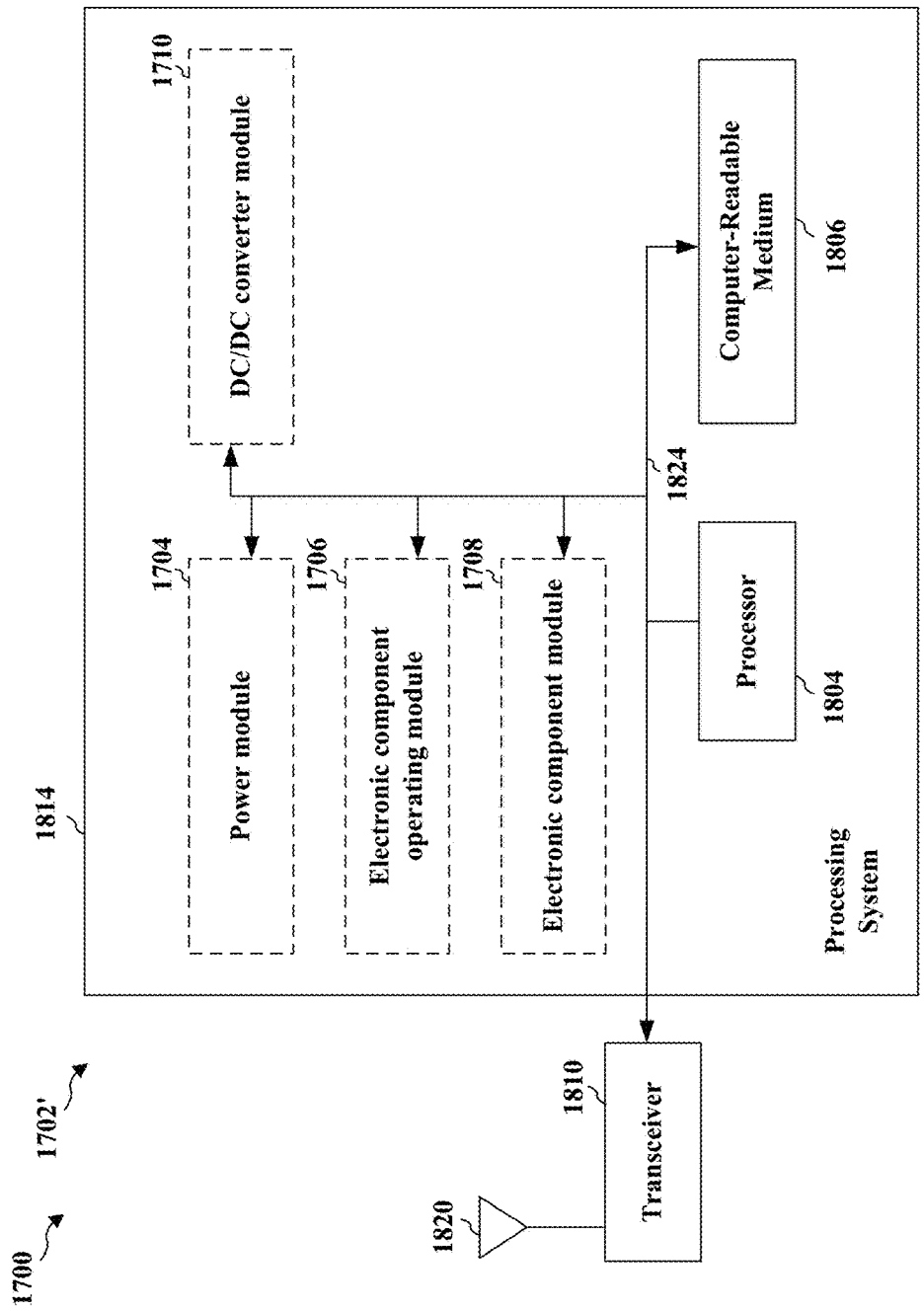
FIG. 18 is a diagram illustrating an example of a hardware implementation for an apparatus employing a processing system.

FIG. 18 is a diagram illustrating an example of a hardware implementation for an apparatus 1702' employing a processing system 1814. The processing system 1814 may be implemented with a bus architecture, represented generally by the bus 1824. The bus 1824 may include any number of interconnecting buses and bridges depending on the specific application of the processing system 1814 and the overall design constraints. The bus 1824 links together various circuits including one or more processors and/or hardware modules, represented by the processor 1804, the modules 1704, 1706, 1708, and 1710, and the computer-readable medium 1806. The bus 1824 may also link various other circuits such as timing sources, peripherals, voltage regulators, and power management circuits, which are well known in the art, and therefore, will not be described any further.

The processing system 1814 may be coupled to a transceiver 1810. The transceiver 1810 is coupled to one or more antennas 1820. The transceiver 1810 provides a means for communicating with various other apparatus over a transmission medium. The processing system 1814 includes a processor 1804 coupled to a computer-readable medium 1806. The processor 1804 is responsible for general processing, including the execution of software stored on the computer-readable medium 1806. The software, when executed by the processor 1804, causes the processing system 1814 to perform the various functions described supra for any particular apparatus. The computer-readable medium 1806 may also be used for storing data that is manipulated by the processor 1804 when executing software. The processing system further includes at least one of the modules 1704, 1706, 1708, and 1710. The modules may be software modules running in the processor 1804, resident/stored in the computer readable medium 1806, one or more hardware modules coupled to the processor 1804, or some combination thereof.

In one configuration, the apparatus 1702/1702' includes means for operating an electronic component, means for receiving power from at least one energy harvester coupled between at least one pair of hot and cold regions of the electronic component and configured to convert thermal energy to electrical energy, the at least one energy harvester comprising a radiative thermal channel or a conductive thermal channel, and means for powering at least the electronic component using the electrical energy. The aforementioned means may be one or more of the aforementioned modules of the apparatus 1702 and/or the processing system 1814 of the apparatus 1702' configured to perform the functions recited by the aforementioned means.

Therefore, by converting thermal energy output by ICs into electrical energy, the battery life of mobile electronic devices using high performance/speed ICs may be advantageously extended. For example, standby time of the mobile electronic devices may be extended by harvesting energy while being used for running applications that consume substantial amounts of power (e.g., multimedia applications). Accordingly, users of mobile electronic devices will experience longer battery life and, therefore, may require less frequent recharging of the batteries powering the mobile electronic devices. For example, a user may need to recharge a battery less often, such as only once per day or week.

In addition, conventional low power design efforts can be redirected to more demanding areas, such as performance enhancement of the ICs. Moreover, the energy harvester configurations disclosed herein may be implemented by maintaining current hardware design methodology, including PCB routing and stacking of multiple dies/chips in an IC.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for a mobile device, the method comprising:
operating an electronic component;
receiving power from at least one energy harvester coupled between a hot region and a cold region of the electronic component and configured to convert thermal energy to electrical energy, the at least one energy harvester comprising a conductive thermal channel; and
powering at least the electronic component using the electrical energy,
wherein a first end of the conductive thermal channel is coupled to a first semiconductor material of the at least one energy harvester and a second end of the conductive thermal channel is coupled to a second semiconductor material of the at least one energy harvester, the first semiconductor material being coupled to the hot region and spaced apart from the cold region by the conductive thermal channel and the second semiconductor material being coupled to the cold region and spaced apart from the hot region by the conductive thermal channel,
wherein the at least one energy harvester further comprises a first pad coupled to the first semiconductor material and coupled to a power pin, the first pad spaced apart from the cold region at least partially by the conductive thermal channel, and
wherein the at least one energy harvester further comprises a second pad coupled to the second semiconductor material and coupled to a ground pin, the second pad spaced apart from the hot region at least partially by the conductive thermal channel.

2. The method of claim 1, wherein:
the conductive thermal channel comprises a wire bond.

3. The method of claim 1, wherein:
the hot region is a first bonding pad situated on a first die; and
the cold region is a second bonding pad situated on a substrate or a second die.

4. The method of claim 1, wherein:
the first semiconductor material is an n-type semiconductor material; and
the second semiconductor material is a p-type semiconductor material.

5. The method of claim 1, wherein the at least one energy harvester is further coupled to a direct current-to-direct current (DC/DC) converter.

6. The method of claim 1, wherein the electronic component is an integrated circuit (IC).

7. The method of claim 1, wherein the conductive thermal material comprises a thermal diode.

8. The method of claim 1, wherein the first pad is directly connected to the first semiconductor material, and the second pad is directly connected to the second semiconductor material.

9. The method of claim 1, wherein the first pad is connected to the first semiconductor material via a first conductive path, the first pad spaced apart from the first semiconductor material by the hot region, and wherein the second pad is connected to the second semiconductor material via a second conductive path, the second pad spaced apart from the second semiconductor material by the cold region.

* * * * *